United States Patent
Shivaram et al.

(10) Patent No.: US 9,893,718 B1
(45) Date of Patent: Feb. 13, 2018

(54) TRANSMISSION DRIVER IMPEDANCE CALIBRATION CIRCUIT

(71) Applicant: GLOBALFOUNDRIES INC., Grand Cayman (KY)

(72) Inventors: Suhas Shivaram, Bangalore (IN); Giri N. K. Rangan, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/295,299

(22) Filed: Oct. 17, 2016

(51) Int. Cl.
*H03K 19/00* (2006.01)
*H03K 3/011* (2006.01)
*H03K 3/012* (2006.01)
*H03K 5/24* (2006.01)
*H03H 11/28* (2006.01)

(52) U.S. Cl.
CPC .............. *H03K 3/011* (2013.01); *H03H 11/28* (2013.01); *H03K 3/012* (2013.01); *H03K 5/24* (2013.01)

(58) Field of Classification Search
CPC .......... H03K 3/011; H03K 3/012; H03K 5/24; H03H 11/28
USPC .......................................................... 326/30
See application file for complete search history.

(56) References Cited

U.S. PATENT DOCUMENTS

| 7,368,902 | B2   | 5/2008  | Clements et al. |
| 7,479,800 | B1 * | 1/2009  | Vullaganti ......... H03K 19/0005 326/21 |
| 7,888,962 | B1   | 2/2011  | Om |
| 8,878,565 | B2 * | 11/2014 | Hara ................ H03K 19/00315 326/26 |
| 9,531,382 | B1 * | 12/2016 | Miwa .................... H03K 19/003 |
| 9,552,894 | B2 * | 1/2017  | Jeong ................... G11C 29/025 |
| 9,787,287 | B2 * | 10/2017 | Baek ..................... H03H 11/28 |

OTHER PUBLICATIONS

Bae et al., A 6-Gb/s Differential Voltage Mode Driver with Independent Control of Output Impedance and Pre-Emphasis Level, Journal of Semiconductor Technology and Science, vol. 13, No. 5, Oct. 2013.

* cited by examiner

*Primary Examiner* — Kenneth B Wells
(74) *Attorney, Agent, or Firm* — David Cain; Hoffman Warnick LLC

(57) ABSTRACT

A transmission driver impedance calibration circuit and method. A circuit is disclosed that includes: a controller for controlling a set of switches; a comparator having an output that is coupled to the controller; and a first comparator input coupled to: a first selectable node coupled between a first p-type adjustable resistor segment (PSEG) and an external resistor; and a second selectable node coupled between a pair of internal resistors; and a second comparator input coupled to: a third selectable node coupled between a second PSEG and a tcoil resistor, the tcoil resistor being further coupled in series to a n-type adjustable resistor segment (NSEG); and a fourth selectable node coupled between the tcoil resistor and the NSEG.

20 Claims, 6 Drawing Sheets

| CALSEG | PCALSEG | CALT | CALB | Comments |
|---|---|---|---|---|
| 0 | 0 | 1 | 0 | Nseg Calibration |
| 1 | 0 | 0 | 1 | Pseg Calibration 1st Step |
| 1 | 1 | 1 | 0 | Pseg Calibration 2nd Step |
| 0 | 1 | 0 | 1 | Not allowed |

TRANSMISSION DRIVER IMPEDANCE CALIBRATION CIRCUIT

TECHNICAL FIELD

The subject matter of this invention relates to transmission driver impedance calibration circuits, and more particularly to a transmission driver impedance calibration circuit that improves performance.

BACKGROUND

Integrated circuit communication, chip to chip, relies upon good input-output (I/O) signal integrity. One significant characteristic of an I/O driver circuit that affects the input-output (I/O) signal integrity is its output impedance with respect to the signal line impedance. Also, variations of both the I/O driver circuit impedance and, e.g., the card impedance often become limiting factors in attaining high speed chip to chip communications with good signal integrity. In general, to maximize the transfer of power in a signal, the output impedance of an output driver circuit should match the input impedance of the transmission media connected to the output driver circuit, such as an electrical cable or another circuit or card.

Various factors that can result in variations of the output impedance of an I/O driver circuit include the process technology itself, along with the operating temperature range and the voltage range for the system. Without attempting to control these factors through some calibration scheme, variations in the output impedance with current state-of-the-art CMOS technology will significantly impact performance. However, current calibration schemes for a transmission driver, which seek for example to maintain a 50 ohm target output impedance, tend to consume significant area and are subject to leakage.

SUMMARY

Aspects of the disclosure provide a circuit that can be used upon power up of a device having a transmitter to determine the optimal settings for pull down segments to achieve, e.g., a 50 ohm output impedance.

A first aspect provides transmission driver impedance calibration circuit, comprising: a controller for controlling a set of switches; a comparator having an output that is coupled to the controller; and a first comparator input coupled to: a first selectable node coupled between a first p-type adjustable resistor segment (PSEG) and an external resistor; and a second selectable node coupled between a pair of internal resistors; and a second comparator input coupled to: a third selectable node coupled between a second PSEG and a tcoil resistor, the tcoil resistor being further coupled in series to a n-type adjustable resistor segment (NSEG); and a fourth selectable node coupled between the tcoil resistor and the NSEG.

A second aspect provides a method of calibrating impedance for a transmission driver, comprising: providing a comparator having: a first input that includes a first selectable node coupled between a first p-type adjustable resistor segment (PSEG) and an external resistor and a second selectable node coupled between a pair of internal resistors; and a second input that includes a third selectable node coupled between a second PSEG and a tcoil resistor, the tcoil resistor being further coupled in series to a n-type adjustable resistor segment (NSEG); and a fourth selectable node coupled between the tcoil resistor and the NSEG; activating the first selectable node and third selectable node; monitoring an output of the comparator while adjusting the NSEG to determine a setting for the NSEG; activating the second selectable node and third selectable node; monitoring the output of the comparator while adjusting the second PSEG to determine a first setting for the second PSEG; activating the second selectable node and fourth selectable node; monitoring the output of the comparator while adjusting the second PSEG to determine a second setting for the second PSEG; and averaging the first setting and second setting to provide a final setting for the second PSEG.

A third aspect provides a transmitter device having a transmission driver impedance calibration circuit, comprising: a controller for controlling a set of switches; a comparator having an output that is coupled to the controller; and a first comparator input coupled to: a first selectable node coupled between a first p-type adjustable resistor segment (PSEG) and an external resistor; and a second selectable node coupled between a pair of internal resistors; and a second comparator input coupled to: a third selectable node coupled between a second PSEG and a tcoil resistor, the tcoil resistor being further coupled in series to a n-type adjustable resistor segment (NSEG); and a fourth selectable node coupled between the tcoil resistor and the NSEG.

BRIEF DESCRIPTION OF THE DRAWINGS

These and other features of this invention will be more readily understood from the following detailed description of the various aspects of the invention taken in conjunction with the accompanying drawings in which.

Figure 1:
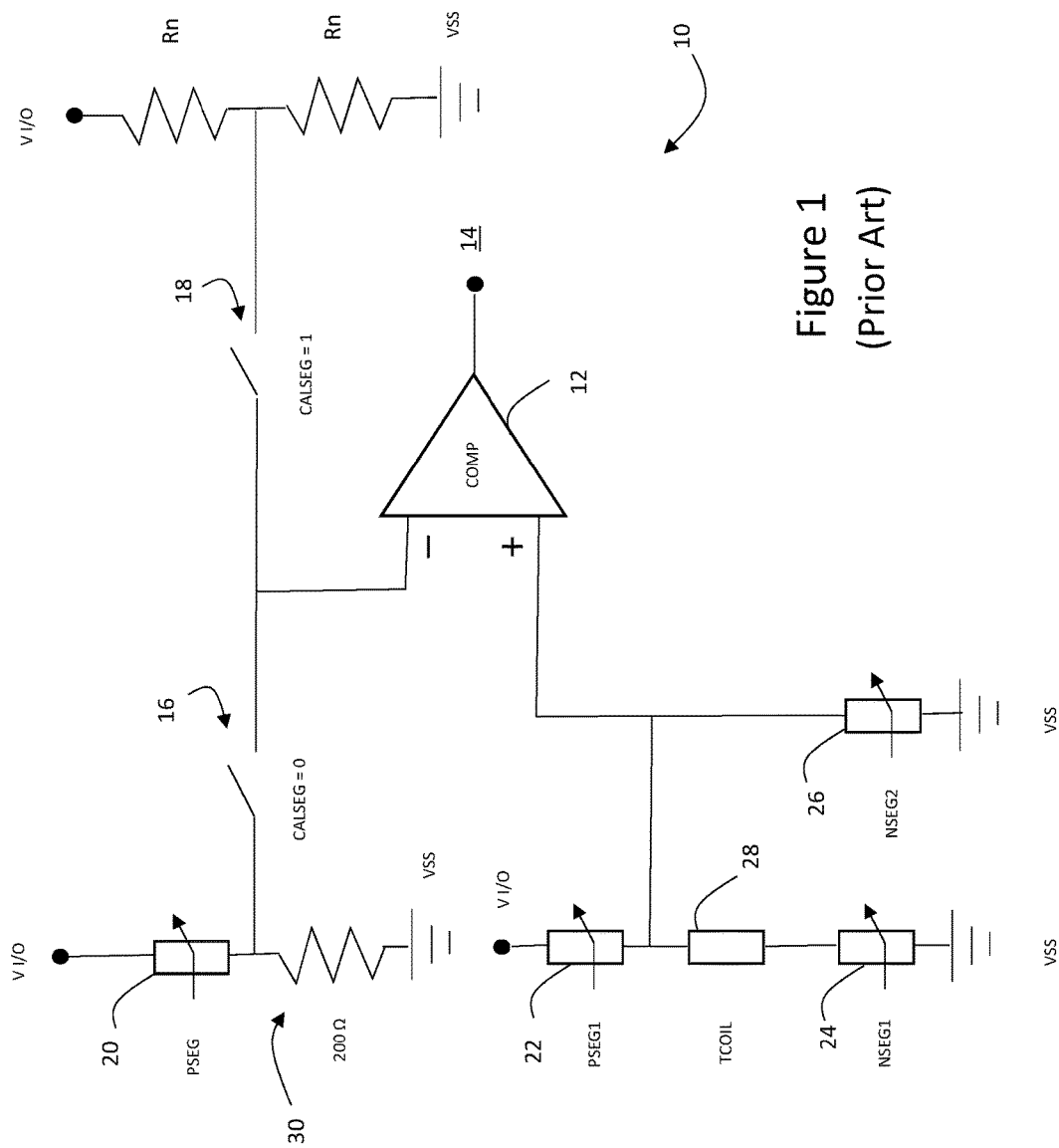
FIG. 1 shows a prior art calibration circuit.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

FIG. 1 depicts a simplified block diagram of a prior art circuit 10 for calibrating transmission impedance. In particular, the purpose of the circuit 10 is to determine, upon power up, the correct settings for NSEGs 24, 26 and PSEG 22 to achieve, e.g., a 50 ohm impedance. This is generally accomplished by configuring the circuit 10 with switches 16 and 18 and monitoring an output 14 from comparator 12 while adjusting the NSEG and PSEG settings. NSEGs and PSEGs 20, 22, 24, 26 comprise n-type and p-type pull down segments whose resistance settings can be adjusted based on an inputted value. In particular, each depicted pull down segment includes a set of CMOS based devices that can be selectively implemented based on the input value to create different resistances.

Using circuit 10, calibration is done in two phases. In phase 1, the goal is to determine the setting of NSEGs 24, 26, so CALSEG is set to 0 such that switch 16 is closed and switch 18 is open, resulting in the presence of TCOIL 28 as a reference (on the positive input to comparator 12) and an external precision resistor 30 as reference (on the negative input to comparator 12). Assuming for example that PSEG 20 is set to 600 ohms, then it is known that the negative input at the comparator 12 is 200/(600+200) V I/O=0.25 V I/O. Assuming PSEG1 22 is then set to 150 ohms and NSEG2 26 is turned off, when NSEG1 24 and TCOIL 28 combine for 50 ohms, the positive input to the comparator 12 will likewise be 0.25 V I/O. Thus NSEG1 24 is adjusted until the comparator 12 sees a 0.25 V I/O at the positive input, which results in NSEG1 24 being calibrated. NSEG1 24 may for example be adjusted using as input a combination of 1R, 2R, 4R and 8R inputs, where R=1200 ohms. The output 14 of the comparator 12 is monitored to determine when 0.25 V I/O is detected at both inputs, which thus dictates that the combination of TCOIL 28 and NSEG2 24 is 50 ohms.

In phase 2, NSEG2 26 is calibrated the same as NSEG1 24 as determined in phase 1, and CALSEG is set to 1 such that switch 16 is closed and switch 18 is open. The top input of the comparator 12 is set to 0.5 V I/O (due to the voltage divider) and the output 14 is monitored as PSEG2 22 is adjusted using as input a combination of 1R, 2R, 4R and 8R, to match the NSEG2, determined in phased 1, which thus determines the proper calibration settings of PSEG1 22.

Figure 2:
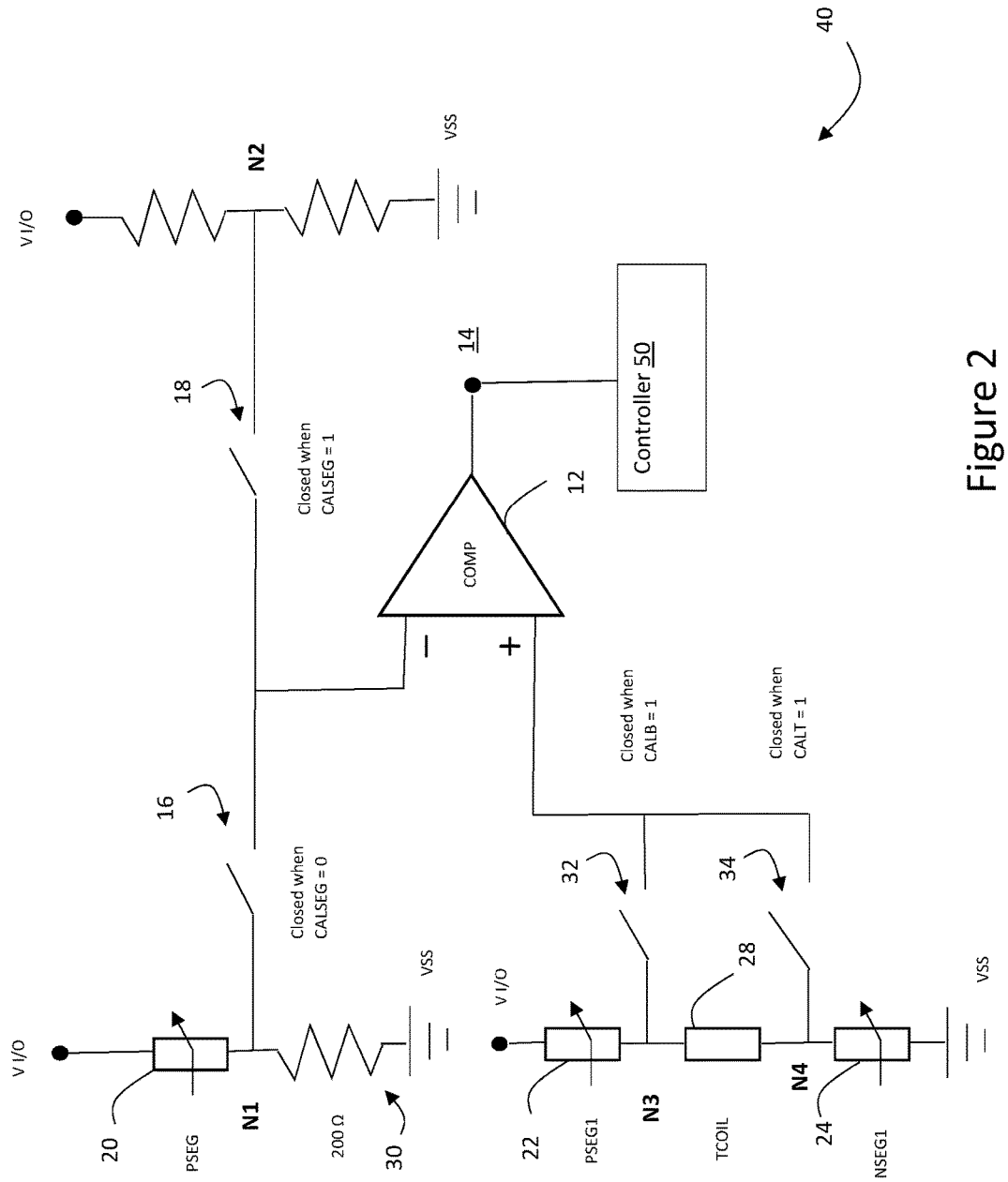
FIG. 2 shows a transmission calibration circuit according to embodiments.

FIG. 2 depicts an improved circuit 40 that operates in a similar manner, but can be implemented using reduced area, lower leakage and higher accuracy. As can be seen, the circuit 40 is similar to circuit 10 (FIG. 1) except that NSEG2 has been removed and replaced with reduced circuitry and a pair of switches 32, 34. Controller 50 provides the necessary logic for controlling switches, adjusting input settings to NSEGs and PSEGs and monitoring the comparator 12.

The resulting circuit 40 likewise utilizes comparator 12 for calibrating PSEG1 22 and NSEG1 24. The comparator 12 includes a negative input that selectively receives input from either node N1 or N2, and includes a positive input that selectively receives input from either node N3 or N4. Each node N1, N2, N3, N4 can be "activated" by closing a respective switch 16, 18, 32, 34.

In this case, phase 1 of the calibration is the same as described above, i.e., nodes N1 and N3 are activated and N2 and N4 are deactivated in order to calibrate NSEG1 24. However, phase 2 is implemented with a two-step process in which nodes N2 and N3 are initially activated (with nodes N1 and N4 deactivated) and then nodes N2 and N4 are subsequently activated (with nodes N1 and N3 deactivated) to calibrate PSEG1 22.

For phase 1, CALSEG is set to 0 such that switch 16 is closed and switch 18 is open. In addition, switch 32 is closed and switch 34 is open, activating N3, resulting in the presence of TCOIL 28 and the external precision resistor 30 as reference. As described above, when PSEG 20 is set to 800 ohms, the negative input to comparator 12 is 0.25 V I/O. TCOIL 28 may for example have a resistance of 2-3 ohms, but could be implemented with any resistance to provide a desired reference impedance (e.g., 1-5 ohms).

PSEG1 22 is set to 150 ohms, and NSEG1 24 is adjusted (using as input a combination of 1R, 2R, 4R and 8R, where R=1200 ohms) until the positive input of comparator 12 is likewise 0.25 V I/O. In particular, the output 14 of the comparator 12 is monitored as NSEG1 24 is adjusted until 50 ohms is achieved by the combination of NSEG1 24 and TCOIL 28, i.e., ¼ the resistance of the resistor 30.

Figure 3:
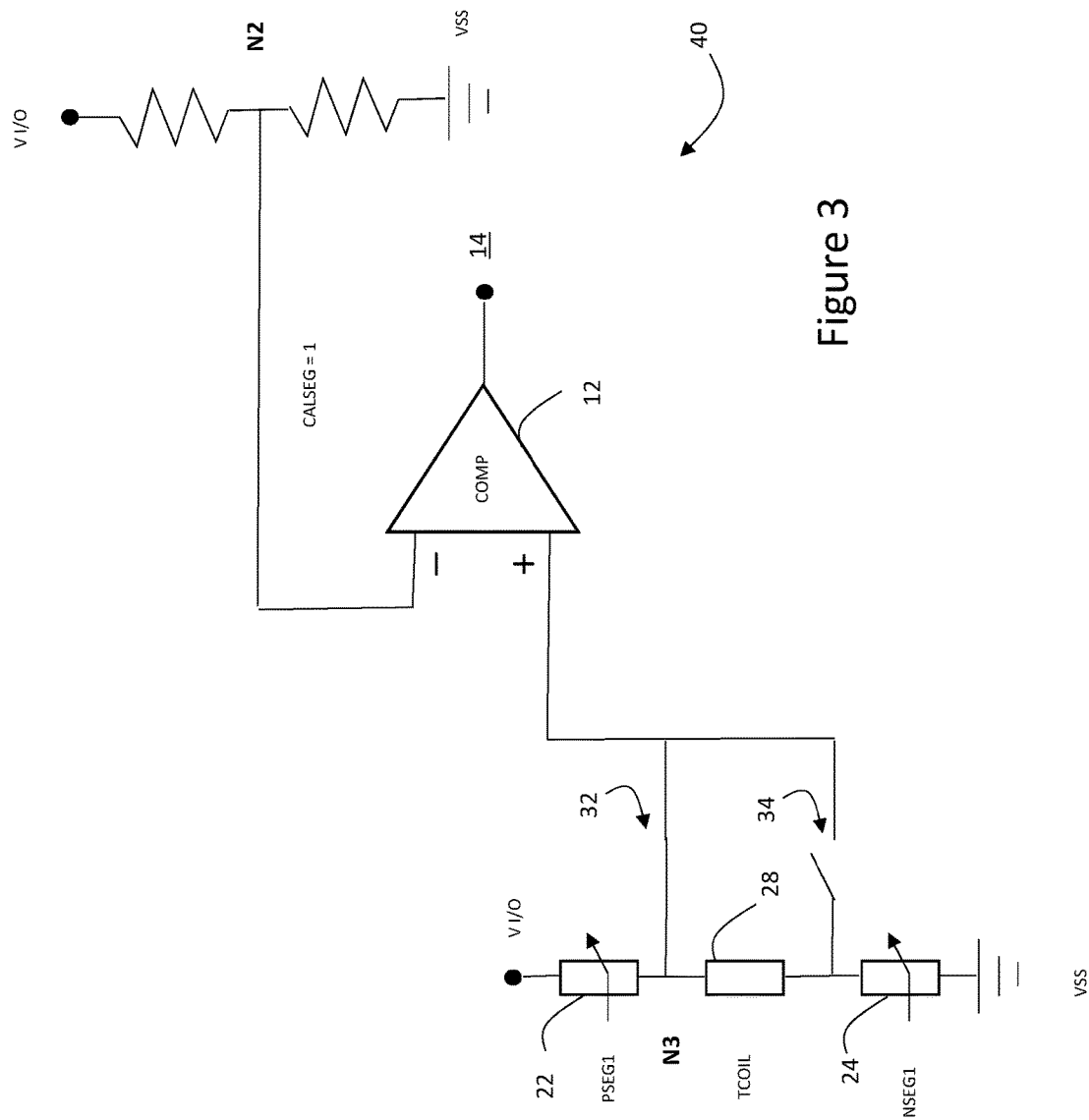
FIG. 3 shows a phase 1 portion of the transmission calibration circuit of FIG. 2 according to embodiments.

In phase 2, PSEG1 22 is calibrated in a two-step process in which two input settings are averaged to achieve the final setting. To calibrate PSEG1 22 in phase 2, CALSEG is set to 1 such that switch 16 is open and switch 18 is closed, which results in 0.5 V I/O at the negative input of comparator 12. In step 1 of phase 2, switch 32 remains closed and switch 34 remains open, resulting in the circuit shown in FIG. 3. During this step, the input to PSEG1 22 is adjusted to determine a first PSEG1 setting. For example, assume that from phase 1 the resistance of TCOIL 28 was 2 ohms and NSEG1 24 was 48 ohms, then PSEG2 22 would be calibrated to 50 ohms by monitoring comparator 12 to determine when the positive input reached 0.5 V I/O.

Figure 4:
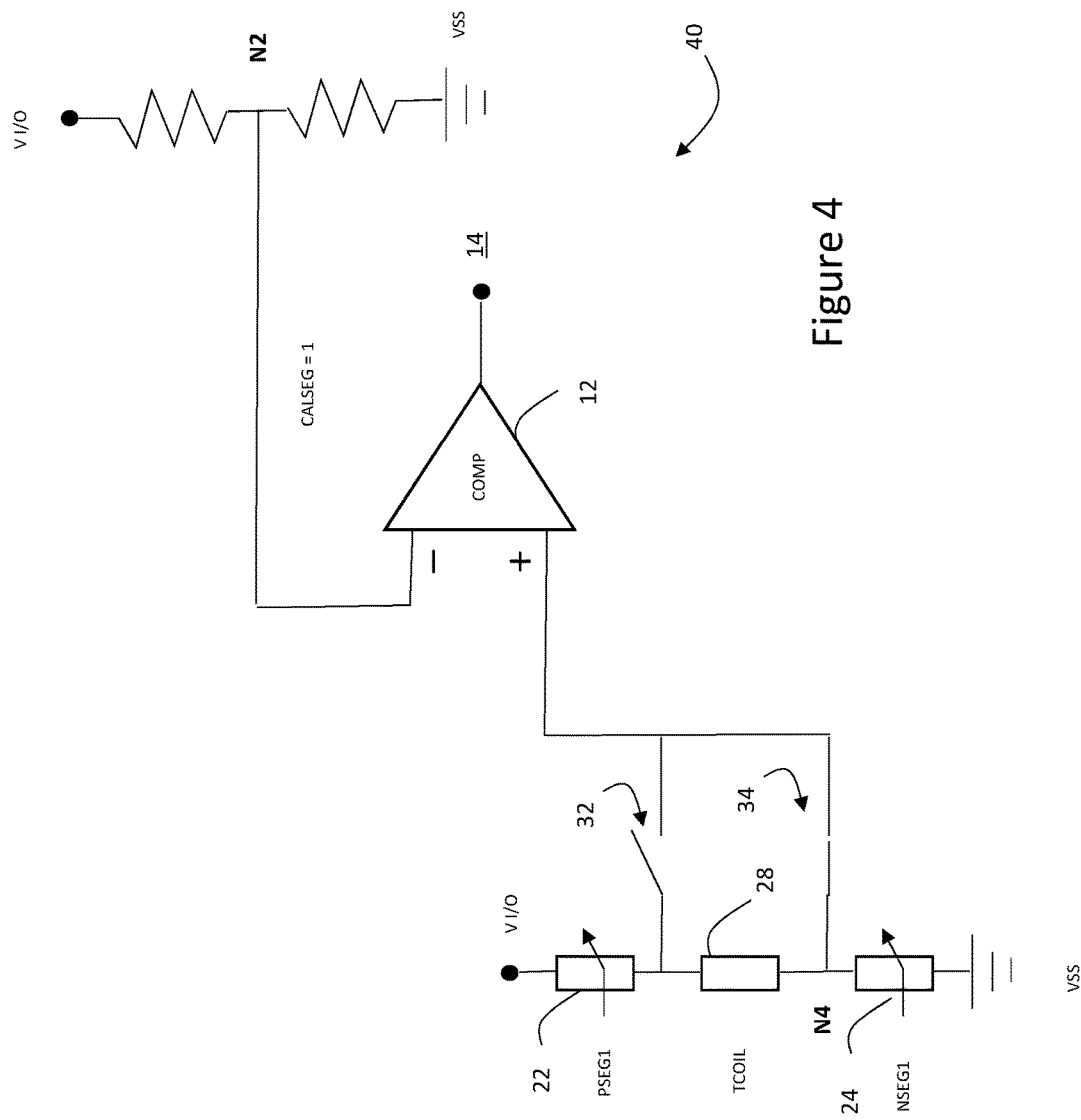
FIG. 4 shows a phase 2 portion of the transmission calibration circuit of FIG. 2 according to embodiments.

For step 2, switch 34 is closed and switch 32 is opened as shown in FIG. 4 and PSEG2 22 is recalibrated, i.e., adjusted until the positive input of comparator 12 is 0.5 V I/O. This occurs when the impedance of PSEG1 22 and TCOIL 28 equal NSEG1 24. For example, if NSEG1 24 was 48 ohms and TCOIL 28 was 2 ohms, then 0.5 V I/O at the positive comparator input would be achieved when PSEG2 22 is calibrated for 46 ohms. Once the second setting of PSEG1 is determined, the average of the two setting is utilized to calibrate PSEG1 to the proper impedance, e.g., (50+46)/2=48 ohms.

Figure 5:
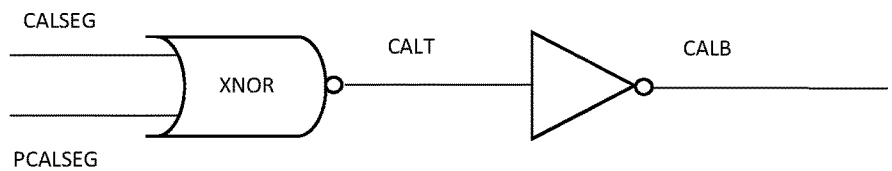
FIG. 5 shows a logic diagram for controlling the switches of FIG. 2 according to embodiments.

As noted, control of all of the switches to perform the calibration is accomplished with controller 50 (FIG. 2). Specific logic may for example be implemented with the circuit shown in FIG. 5. For example, for phase 1, both CALSEG and PCALSEG are set to 0 such that switches 16 and 32 are closed. For phase 2 CALSEG is set to 1 and PCALSEG is initially set to 1 (step 1) and switches to 0 (step 2). The result is that switch 18 is maintained closed and switch 32 (CALB=1) is initially closed and switch 34 (CALT=0) is open (step 1). When PCALSEG switches to 0, switch 32 (CALB=0) opens and switch 34 (CALT=1) closes.

Figure 6:
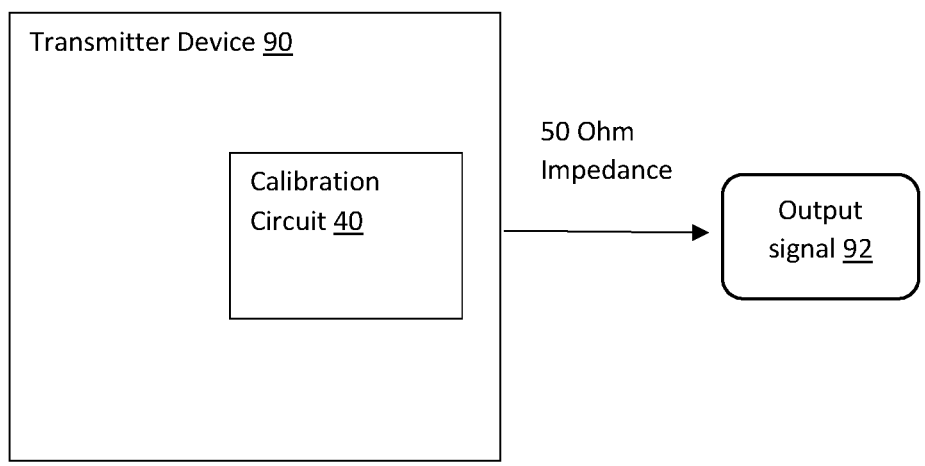
FIG. 6 shows a transmitter device according to embodiments.

FIG. 6 depicts a transmitter device 90 having the circuit 40 of FIG. 2 to generate an output signal 92 with a 50 ohm impedance. Transmitter device 90 may comprise any circuitry, chip, card, etc., that is required to output signals at a predetermined impedance.

Note that in the described circuits, the output of transmitter device 90 (i.e., driver) is capacitively loaded due to electrostatic discharge (ESD) protection circuits and output capacitive load of the driver. This RC product severely limits the throughput data rate. In order to mitigate this effect, a bandwidth enhancement technique is employed with an inductive element. This inductive element is referred to herein as a tcoil (e.g., TCOIL 28) due to its T structure. Since the tcoil comprises a spiral coil of metal, it has its own direct current (DC) impedance. While calibrating the DC impedance, the tcoil DC impedance acts in series with pull up or pull down segment impedance to mitigate the aforementioned limitation.

The foregoing description of various aspects of the invention has been presented for purposes of illustration and description. It is not intended to be exhaustive or to limit the invention to the precise form disclosed, and obviously, many modifications and variations are possible. For example, the specific values and settings described herein for the various circuit elements, including TCOIL 28, external resistor 30, NSEGS and PSEGS, etc., may be altered without departing from the scope of the invention. Such modifications and variations that may be apparent to an individual in the art are included within the scope of the invention as defined by the accompanying claims.

What is claimed is:

1. A transmission driver impedance calibration circuit, comprising:
    a controller for controlling a set of switches;
    a comparator having an output that is coupled to the controller; and
    a first comparator input coupled to:
        a first selectable node coupled between a first p-type adjustable resistor segment (PSEG) and an external resistor; and
        a second selectable node coupled between a pair of internal resistors; and
    a second comparator input coupled to:
        a third selectable node coupled between a second PSEG and a tcoil resistor, the tcoil resistor being further coupled in series to an n-type adjustable resistor segment (NSEG); and
        a fourth selectable node coupled between the tcoil resistor and the NSEG.

2. The transmission driver impedance calibration circuit of claim 1:
    wherein the controller includes logic that implements a first configuration for calibrating the NSEG that includes activating the first selectable node and third selectable node;
    wherein the controller includes logic that implements a second configuration for calibrating the second PSEG that includes first activating the second selectable node and third selectable node to determine a first PSEG setting, and then deactivating the third selectable node and activating the fourth selectable node to determine a second PSEG setting;
    and wherein a final PSEG setting comprises an average of the first PSEG setting and second PSEG setting.

3. The transmission driver impedance calibration circuit of claim 1, wherein the external resistor comprises a 200 ohm external precision resistor.

4. The transmission driver impedance calibration circuit of claim 1, wherein the pair of internal resistors are arranged in series to form an internal resistor divider between a voltage I/O and a ground to generate a value of 0.5 times the voltage I/O at the first comparator input.

5. The transmission driver impedance calibration circuit of claim 1, wherein the first PSEG and the external resistor are arranged in series between a voltage I/O and a ground to generate a value of 0.25 times the voltage I/O at the first comparator input.

6. The transmission driver impedance calibration circuit of claim 1, wherein the second PSEG, tcoil resistor, and NSEG are arranged in series between a voltage I/O and a ground.

7. The transmission driver impedance calibration circuit of claim 1, wherein the tcoil has an impedance of between 1 and 5 ohms.

8. A method of calibrating impedance for a transmission driver, comprising:
    providing a comparator having: a first input that includes a first selectable node coupled between a first p-type adjustable resistor segment (PSEG) and an external resistor and a second selectable node coupled between a pair of internal resistors; and a second input that includes a third selectable node coupled between a second PSEG and a tcoil resistor, the tcoil resistor being further coupled in series to an n-type adjustable resistor segment (NSEG); and a fourth selectable node coupled between the tcoil resistor and the NSEG;
    activating the first selectable node and third selectable node;
    monitoring an output of the comparator while adjusting the NSEG to determine a setting for the NSEG;
    activating the second selectable node and third selectable node;
    monitoring the output of the comparator while adjusting the second PSEG to determine a first setting for the second PSEG;
    activating the second selectable node and fourth selectable node;
    monitoring the output of the comparator while adjusting the second PSEG to determine a second setting for the second PSEG;
    averaging the first setting and second setting to provide a final setting for the second PSEG.

9. The method of claim 8, wherein the external resistor comprises a 200 ohm external precision resistor.

10. The method of claim 8, wherein the first PSEG and the external resistor are arranged in series between a voltage I/O and a ground to generate a value of 0.25 times the voltage I/O at the first comparator input.

11. The method of claim 8, wherein the pair of internal resistors are arranged in series to form an internal resistor divider between a voltage I/O and a ground to generate a value of 0.5 times the voltage I/O at the first comparator input.

12. The method of claim 8, wherein the second PSEG, tcoil resistor, and NSEG are arranged in series between a voltage I/O and a ground.

13. The method of claim 8, wherein a controller is used to activate and deactivate the first, second, third and fourth selectable node.

14. The method of claim 8, wherein the tcoil has an impedance of between 1 and 5 ohms.

15. A transmitter device having a transmission driver impedance calibration circuit, comprising:
    a controller for controlling a set of switches;
    a comparator having an output that is coupled to the controller; and
    a first comparator input coupled to:
        a first selectable node coupled between a first p-type adjustable resistor segment (PSEG) and an external resistor; and
        a second selectable node coupled between a pair of internal resistors; and
    a second comparator input coupled to:
        a third selectable node coupled between a second PSEG and a tcoil resistor, the tcoil resistor being further coupled in series to an n-type adjustable resistor segment (NSEG); and
        a fourth selectable node coupled between the tcoil resistor and the NSEG.

16. The transmitter device of claim 15:
    wherein the controller includes logic that implements a first configuration for calibrating the NSEG that includes activating the first selectable node and third selectable node;
    wherein the controller includes logic that implements a second configuration for calibrating the second PSEG that includes first activating the second selectable node and third selectable node to determine a first PSEG setting, and then deactivating the third selectable node and activating the fourth selectable node to determine a second PSEG setting;
    and wherein a final PSEG setting comprises an average of the first PSEG setting and second PSEG setting.

17. The transmitter device of claim 15, wherein the external resistor comprises a 200 ohm external precision resistor and wherein the first PSEG and the external resistor are arranged in series between a voltage I/O and a ground to generate a value of 0.25 times the voltage I/O at the first comparator input.

18. The transmitter device of claim 15, wherein the pair of internal resistors are arranged in series to form an internal resistor divider between a voltage I/O and a ground to generate a value of 0.5 times the voltage I/O at the first comparator input.

19. The transmitter device of claim 15, wherein the second PSEG, tcoil resistor, and NSEG are arranged in series between a voltage I/O and a ground.

20. The transmitter device of claim 15 wherein the tcoil has an impedance of between 1 and 5 ohms.

* * * * *